United States Patent
Wohlfarth

(10) Patent No.: US 10,381,250 B2
(45) Date of Patent: Aug. 13, 2019

(54) METHOD FOR INTRODUCING A SUBSTRATE INTO A MEASURING APPARATUS AND DEVICE FOR CARRYING OUT THE METHOD

(71) Applicant: Carl Zeiss SMT GmbH, Oberkochen (DE)

(72) Inventor: Nico Wohlfarth, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/263,673

(22) Filed: Sep. 13, 2016

(65) Prior Publication Data

US 2017/0084474 A1 Mar. 23, 2017

(30) Foreign Application Priority Data

Sep. 18, 2015 (DE) .................. 10 2015 218 037

(51) Int. Cl.
*H01L 21/67* (2006.01)
*H01L 21/677* (2006.01)

(52) U.S. Cl.
CPC .. *H01L 21/67703* (2013.01); *H01L 21/67242* (2013.01); *H01L 21/67778* (2013.01)

(58) Field of Classification Search
CPC ......... H01L 21/67242; H01L 21/67259; H01L 21/67288; H01L 21/67703
See application file for complete search history.

(56) References Cited

U.S. PATENT DOCUMENTS

| | | | |
|---|---|---|---|
| 6,019,564 A | 2/2000 | Kiyokawa et al. | |
| 6,377,870 B1 | 4/2002 | Blaesing-Bangert et al. | |
| 7,443,500 B2 | 10/2008 | Kaller | |
| 9,460,942 B2 * | 10/2016 | Nakaharada | H01L 21/67046 |
| 2002/0095999 A1 | 7/2002 | Birkner et al. | |
| 2007/0107656 A1* | 5/2007 | Shinozaki | H01L 21/67259 |
| | | | 118/50 |
| 2008/0225261 A1 | 9/2008 | Hirayanagi | |
| 2010/0153059 A1 | 6/2010 | Klose et al. | |
| 2011/0033957 A1* | 2/2011 | Holden | G01B 11/0683 |
| | | | 438/16 |

(Continued)

FOREIGN PATENT DOCUMENTS

| | | | |
|---|---|---|---|
| DE | 196 44 509 | 4/1997 | ............ H01L 21/68 |
| DE | 199 49 055 | 4/2001 | ............... A61C 5/08 |

(Continued)

OTHER PUBLICATIONS

Office Action dated Jun. 20, 2016 directed to German Patent Office Application DE 10 2015 218 037.9.

*Primary Examiner* — Ronald P Jarrett
(74) *Attorney, Agent, or Firm* — Fish & Richardson P.C.

(57) ABSTRACT

A method for introducing a substrate into a measuring apparatus, in particular a lithography mask into a coordinate measuring machine, includes the following steps: a) providing a first substrate in a start station; b) transporting the first substrate to a parking station; c) transporting a second substrate from the measuring apparatus to the start station; and d) transporting the first substrate from the parking station into the measuring apparatus. Measurements are carried out on the second substrate during the process of introducing the first substrate. A device for carrying out the method is also provided.

24 Claims, 5 Drawing Sheets

(56) References Cited

U.S. PATENT DOCUMENTS

2013/0164113 A1* 6/2013 Lada ................. H01L 21/67742
                                                                               414/806
2015/0380285 A1* 12/2015 Huseinovic ........... H01L 21/265
                                                                               438/530

FOREIGN PATENT DOCUMENTS

| DE | 199 49 005 | 5/2001 | ............. G01N 35/00 |
| DE | 101 03 253 | 8/2002 | ............. B65G 49/07 |
| DE | 103 32 110 | 1/2005 | ............. G01M 11/02 |
| DE | 10 2007 033 814 | 10/2008 | ................ G03F 9/00 |
| JP | 2006-237480 | 9/2006 | ........... H01L 21/027 |

* cited by examiner

METHOD FOR INTRODUCING A SUBSTRATE INTO A MEASURING APPARATUS AND DEVICE FOR CARRYING OUT THE METHOD

CROSS-REFERENCE TO RELATED APPLICATION

Under 35 U.S.C. § 119, this application claims priority to German Patent Application 10 2015 218 037.9, filed on Sep. 18, 2015. The disclosure content of the above application is hereby incorporated by reference in its entirety.

TECHNICAL FIELD

The invention relates to a method for introducing a substrate into a measuring apparatus and to a device for carrying out the method.

BACKGROUND

The measurement of substrates is used in many branches of industry. It serves for achieving a predefined accuracy in the production of substrates and for continuous quality assurance. The dimensions of substrates or of structures which are formed on substrates can be measured by coordinate measuring machines. For producing semiconductors, for example, use is made of mask blanks for producing finished masks (also referred to as reticles) used to transfer structures to silicon wafers. Both the mask blanks and the masks or the wafers are examples of substrates which must be measured highly accurately. The coordinate measuring machines used for said substrates are also referred to as registration measuring apparatuses.

For the highly accurate measurement of substrates, the latter have to be prepared.

One example of preparation is regulating the temperature of the mask. For the highly accurate measurement of substrates, the temperature within the measuring apparatus has to be constant. The measuring apparatuses are often accommodated in a climate-controlled chamber. The temperature fluctuations in said climate-controlled chamber are less than 0.5 K for example for the measurement of masks.

The substrates are stored outside the climate-controlled chamber in transport containers. The latter serve for protection against contamination and against damage. When the mask is introduced into the climate-controlled chamber, the substrate is removed from the transport container. The temperature of the substrate is then adapted to the temperature within the climate-controlled chamber by virtue of spontaneous cooling or heating of the substrate. The measurement can only be performed when the substrate has reached the temperature of the climate-controlled chamber or the temperature within the measuring apparatus. This step of regulating the temperature of the substrate is very time-consuming. A device and a method for introducing a substrate into a measuring apparatus are described in the published patent application DE19949005.

A further example of preparation for measuring a substrate is placing and aligning the substrate on a substrate holder. Measuring apparatuses are known in which substrates for measurement are placed onto a substrate holder. The position of the substrate on the substrate holder then has to be determined before the measurement of the substrate. Such methods are disclosed in the published German Patent Application DE102007033814.

Measuring apparatuses, in particular for measuring masks, are very complex and thus expensive apparatuses. A time-consuming preparation of the substrates increases the expenditure of time before the measuring apparatus is used. This gives rise to times when the measuring apparatus cannot be used since it is necessary to wait until the substrate to be measured has been prepared. Thus, very expensive measuring apparatus are not utilized optimally.

SUMMARY

The object of the invention, therefore, is to provide a method and a device which improve the process of introducing substrates into measuring apparatuses in such a way that a higher capacity utilization of the measuring apparatus is made possible.

According to the invention, this object is achieved by means of a method for introducing a substrate into a measuring apparatus, comprising the following steps:
a) providing a first substrate in a start station;
b) transporting the first substrate to a parking station;
c) transporting a second substrate from the measuring apparatus to the start station;
d) transporting the first substrate from the parking station into the measuring apparatus;
wherein measurements are carried out on the second substrate during the process of introducing the first substrate.

This measure has the advantage that the first substrate introduced into the measuring apparatus is already transported to the parking station while the measurement on the second substrate is carried out. After the end of the measurement of the second substrate, the second substrate can be removed from the measuring apparatus and the first substrate can be introduced into the measuring apparatus without a time delay.

In a further configuration of the invention, steps b) and c) are performed at least partly simultaneously.

This measure has the advantage of the further saving of time.

In a further configuration of the invention, step b) comprises the following substeps:
b1) transporting the first substrate from the start station to a transfer station;
b2) transporting the first substrate from the transfer station to the parking station.

In a further configuration of the invention, step c) comprises the following substeps:
c1) transporting the second substrate from the measuring apparatus to the transfer station;
c2) transporting the second substrate from the transfer station to the start station.

In a further configuration of the invention, a first substrate holder is provided in the first transfer station and the first substrate is placed on the first substrate holder in step b1), wherein the further transport of the first substrate is performed jointly with the first substrate holder.

This measure has the advantage that the substrate is protected against damage by means of the substrate holder during further transport. This measure is particularly advantageous if the device for introducing a substrate is arranged in a climate-controlled chamber having a predefined temperature in which the conditions of a clean room additionally prevail. This then avoids a situation in which the substrate holder with the substrate is removed from the climate-controlled chamber. The contamination of the substrate holder is avoided as a result. The substrate holder is moreover always exposed to the temperature of the climate-controlled chamber. As a result, a temperature adaptation to the temperature within the climate-controlled chamber is avoided, which would have to be performed if the substrate holder were introduced into the climate-controlled chamber only shortly before the performance of a measurement.

In a further configuration of the invention, the second substrate is arranged on a second substrate holder during the transport from the measuring apparatus in step c1), wherein the transport as far as the transfer station is performed jointly with the second substrate holder.

In a further configuration of the invention, in step c2) the second substrate holder remains in the transfer station and the second substrate is transported to the start station.

In the case of this measure, two substrate holders remain within the climate-controlled chamber and the measuring apparatus. A first substrate holder for the substrate to be newly introduced; a second substrate holder for the second substrate of the current measurement. The advantages of the measure explained above apply to the second substrate holder as well. Renewed regulation of the temperature of the substrate holders after the introduction thereof into the climate-controlled chamber and a possible contamination of the substrate holders are avoided.

In a further configuration of the invention, the first substrate is prepared for measurement in the parking station.

This measure has the advantage that the preparation of the first substrate for measurement is performed outside the measuring apparatus and the use of the measuring apparatus is thus optimized further.

In a further configuration of the invention, the position of the substrate relative to the substrate holder is determined for the preparation in the parking station.

This measure has the advantage that a further time-consuming step is performed outside the measuring apparatus.

In a further configuration of the invention, the position of the substrate is aligned relative to the substrate holder in the parking station.

This measure is necessary particularly if a measurement of the position from the step explained above leads to the result that the substrate lies in the substrate holder in such a way that a measurement is not possible. It has the advantage that a further time-consuming step is performed outside the measuring apparatus. In one variant of this measure, the alignment process is performed by raising the substrate by means of the second transport device, correcting the position by means of the transport device, and placing the substrate.

In a further configuration of the invention, the temperature of the substrate is adapted to the ambient temperature for the preparation.

This measure has the advantage that a further time-consuming step is performed outside the measuring apparatus.

The invention additionally comprises a device for introducing a substrate to be measured into a measuring apparatus, comprising:
a start station,
a first transport device,
a transfer station,
a second transport device,
wherein the first transport device is designed to bring the substrate from the start station to the transfer station, and
the second transport device is designed to introduce the substrate from the transfer station into a connectable measuring apparatus.

This measure has the advantages that have already been explained above in the case of the method according to the invention.

In a further configuration of the invention, the second transport device is designed to remove a second substrate from the measuring apparatus and to transport it to the parking station.

This measure has the advantage that it makes accessible the above-described advantages of the use of a parking station.

In a further configuration of the invention, the device is accommodated jointly with the measuring apparatus in a climate-controlled chamber in which a setpoint temperature is predefined, wherein the deviation of the actual temperature from the setpoint temperature is less than 0.5 K.

This measure has the advantage that regulation of the temperature of the substrates is made possible in a simple manner. Particularly in conjunction with placing the substrate in the parking station, an adaptation of the temperature is performed in a simple manner.

In a further configuration of the invention, a loading station is connected to the start station, said loading station being designed for removing the substrate from a transport container and introducing it into the start station.

This measure enables the substrate to be introduced into the device in a simple manner. Provided that the device is arranged in a climate-controlled chamber, the loading station can be part of a lock. The latter makes it possible to register the introduction of the substrate into the climate-controlled chamber without contaminants.

In a further configuration of the invention, the first or the second transport device is embodied as a robot arm This measure has the advantage that the transport of the substrates is made possible in a simple and rapid manner.

In a further configuration of the invention, the start station is embodied as a magazine for storing a plurality of substrates.

This measure has the advantage that it is possible to store numerous substrates for rapid and simple availability within the climate-controlled chamber. This measure can be used for providing specific substrates for calibrating the measuring apparatus.

In a further configuration of the invention, the substrate is embodied as a mask for the exposure of wafers.

This measure has the advantage that the efficient measurement of masks is made possible. In the case of this measure, the measuring apparatus is preferably embodied as a registration measuring apparatus.

In a further configuration of the invention, the substrate holder is embodied as a mask holder.

In a further configuration of the invention, the substrate is embodied as a wafer.

It goes without saying that the previously mentioned features of the invention and those yet to be explained below can be used not only in the described combinations but also in further combinations or individually, without departing from the scope of the present invention.

BRIEF DESCRIPTION OF DRAWINGS

The invention is described and explained in greater detail below on the basis of some selected exemplary embodiments and with reference to the drawings.

In the figures.

DETAILED DESCRIPTION

Figure 1:
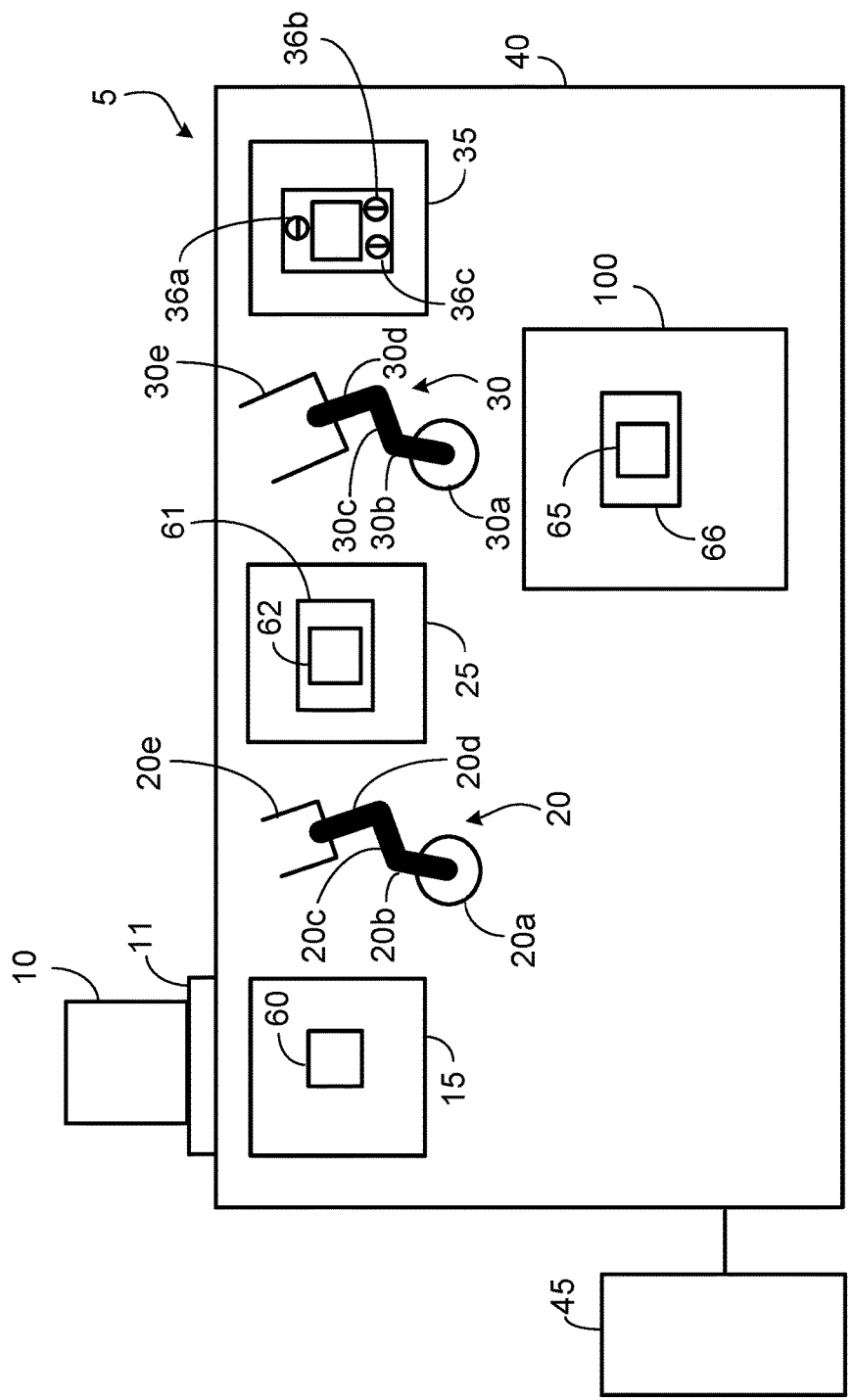
FIG. 1: shows a schematic illustration of a device for introducing a substrate into a measuring apparatus.

A device 5 for introducing a substrate 60 into a measuring apparatus 100 is explained with reference to the schematic diagram in FIG. 1. In the loading station 10, the substrate 60, here embodied as a rectangular mask, is removed from a transport container and introduced through a sliding door 11 into a climate-controlled chamber 40 and is placed on a start station 15 arranged there. The start station 15 is embodied as a table onto which the substrate can be placed. Three hemispherical elevations are applied (not illustrated in the drawing) on the start station. When the mask is emplaced, these three elevations come into contact with the edge region of the mask surface. Destruction of the surface of the substrate is thus avoided. In one variant of this device, the start station is embodied as a mask library. In a library a plurality of masks can be placed one above another. In one variant of the mask library, a plurality of the tables described are arranged one above another.

The climate-controlled chamber is equipped with a temperature regulation (not illustrated in FIG. 1). A predefined temperature is kept constant with a deviation of a maximum of 0.5 K. In addition, the conditions of a clean room are fulfilled within the chamber. For this purpose, the air flowing into the chamber is cleaned by Hepa filters.

In addition to the start station 15, a first transport device 20, a transfer station 25, a second transport device 30, a parking station 35 and a measuring apparatus 100 are arranged in the climate-controlled chamber 40. A computing unit 45 serves for controlling the device and the measuring apparatus. The first transport device 20 is embodied as a robot. The latter comprises a column 20a connected to the base of the climate-controlled chamber 40 in a rotatable manner. The column 20a is connected to a first segment 20b in a moveable manner. The segment 20b is connected to a second segment 20c in a moveable manner and said second segment is connected to a third segment 20d in a moveable manner. The three segments 20a, 20b, 20c form a robot arm. The third segment 20d is connected to a holder 20e in a moveable manner. The holder 20e is designed to grip the substrate 60. The gripping is performed by clamping two opposite edges of the substrate 60 with two prongs of the holder 20e. The segments of the robot arm and the holder 20e and the prongs of the holder are moveable relative to one another by means of motors or actuators. The first robot 20 is connected to the computing unit 45. The motors or actuators of the robot are controlled by the computing unit 45 in such a way that said robot can bring the holder 20e into the desired position for receiving or placing the substrate 60. The robots can move the holder about 6 axes, in one variant about 4 axes.

The transfer station 25 is arranged alongside the first transport device or the first robot. Said transfer station is embodied as a table on which a first substrate holder 61 can be placed. The substrate holder 61 is embodied as a mask holder. The first robot 20 is designed to receive the mask 60 from the start station 15 and to place it on the first mask holder 61 arranged on the transfer station 25. The mask holder has an opening 62, into which the mask 60 is placed.

In one variant of the transfer station 25, the latter is designed for placing a substrate 60, without a substrate holder being provided. The placement is then performed, as described in the case of the start station 15, on three bearing points.

The second transport device 30 is embodied as a second robot. This robot 30 is substantially identical to the first robot in terms of construction and function. A robot arm comprising three segments 30b, 30c, 30d is connected to the base of the climate-controlled chamber 40 via a column 30a. The third segment is connected to a holder 30e. Said holder 30e is designed to grip the first substrate holder 61. The arrangement of the motors or actuators and the control of the robot 30 by the computing unit 45 are performed as described in the case of the first robot 20.

A parking station 35 is arranged alongside the second robot 30. The parking station 35 is embodied as a table on which the substrate holder 61 can be placed. In one variant of the parking station 35, the latter is designed for placing a substrate 60, without a substrate holder being provided. The placement of the substrate 60 is then performed, as described in the case of the start station 15, on three bearing points.

The robot 30 is arranged for transporting substrates 60, 65 or substrate holders 61, 66 arbitrarily back and forth between the transfer station 25, the parking station 35 and a measuring apparatus 100.

The measuring apparatus 100 is embodied as a coordinate measuring machine, in one variant as a registration measuring apparatus for measuring masks or wafers for lithography. A registration measuring apparatus 100 is explained with reference to the schematic diagram from FIG. 2.

An illumination unit 105 illuminates a mask 65 resting on a mask holder 66. The mask holder is arranged on a stage 110. The stage 110 has an opening in the region of the mask, such that the illumination radiation of the light source 105 can reach the lens 115 arranged downstream. Through the lens 115, the image of the mask surface is imaged on a detector 120. The illumination unit 105 comprising optical system and detector form a microscope. The optical axis thereof is designated by the reference sign 130. The stage 110 is moveable in the plane perpendicular to the optical axis 130.

The mask holder has three hemispherical supports 68a, 68b, 68c at the underside. When the mask holder is placed onto the stage 110, the supports latch into accurately fitting notches 111a, 111b, 111c formed on the stage 110. The position of the mask holder 66 with respect to the stage 110 is thus defined.

Figure 2:
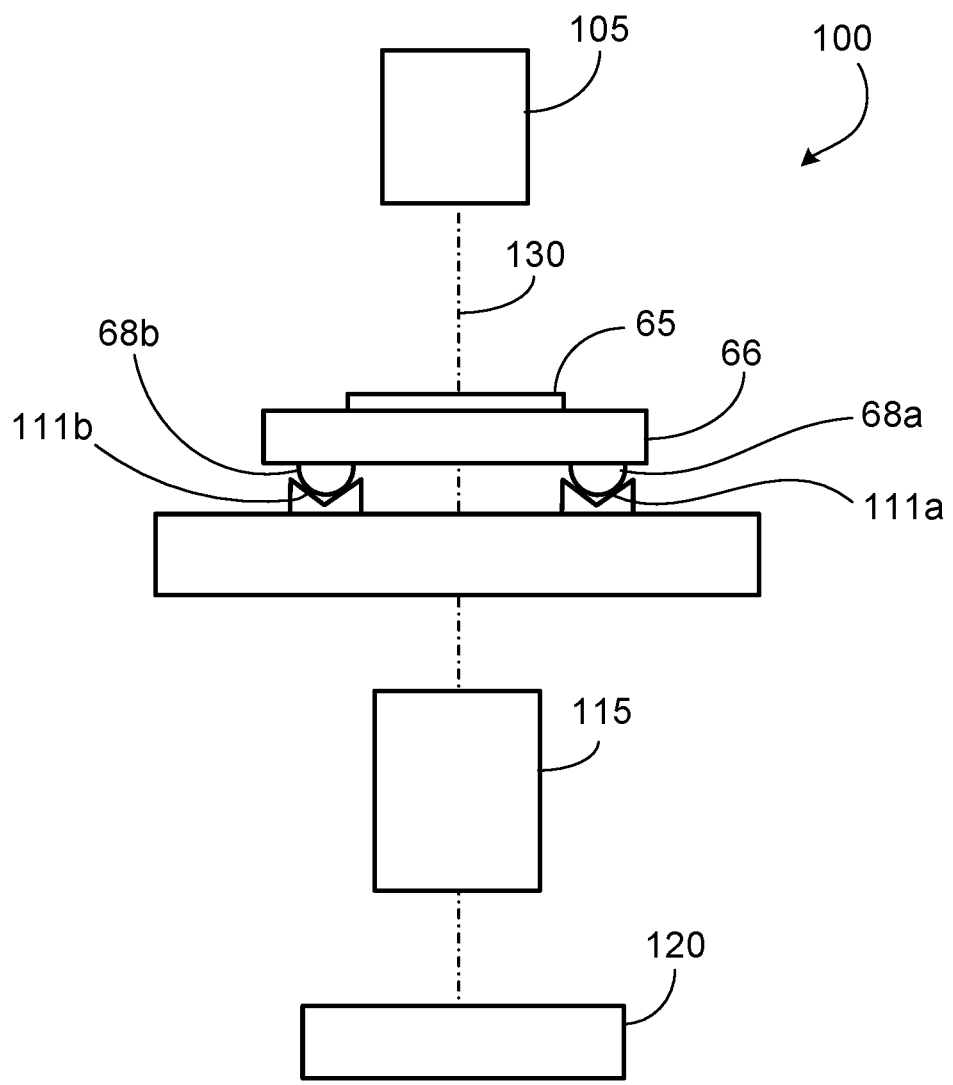
FIG. 2: shows a schematic illustration of a measuring apparatus into which substrates can be introduced.

The position of the stage can be determined highly accurately by means of interferometers (not illustrated in FIG. 2).

After the stage 110 has been moved to the desired position, aerial images of the mask surface are recorded. By evaluating said aerial images, the positions of the desired features are determined. Details concerning measuring apparatus and method are disclosed in DE102007033814 cited above.

For the highly accurate measurement of the mask, in one variant of the method, the position of the mask on the mask holder is determined.

Figure 3:
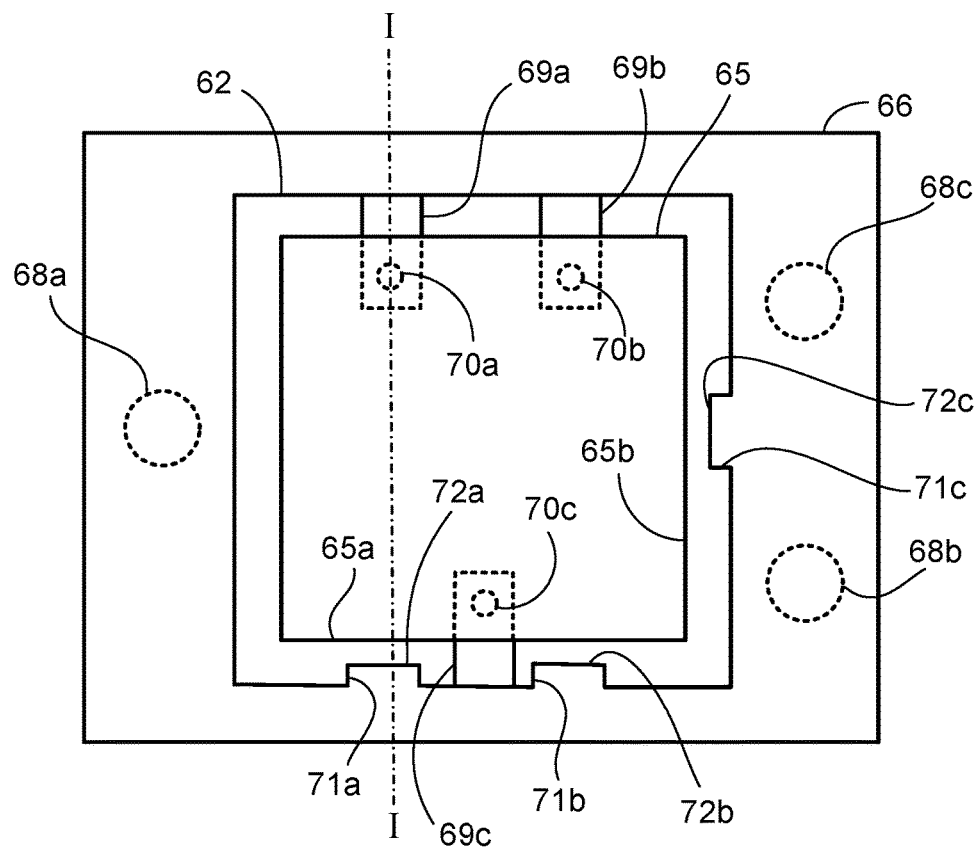
FIG. 3: shows a schematic illustration of a mask holder with an emplaced mask in plan view.
Figure 4:
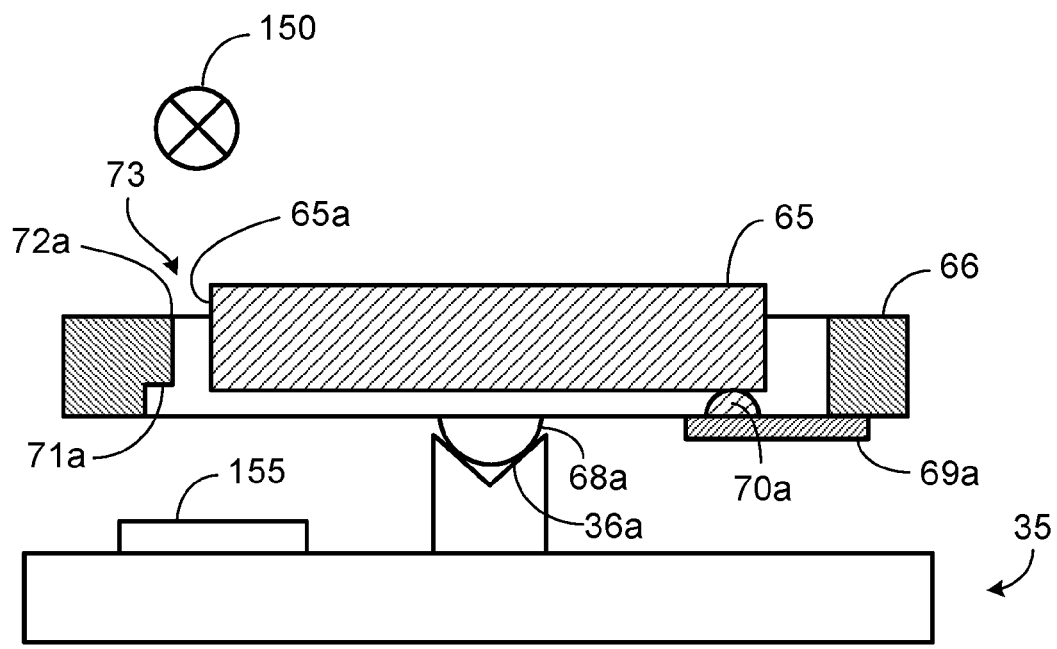
FIG. 4: shows a longitudinal section I-I through the mask holder from FIG. 3.

The construction and the function of the mask holder 66 will be explained with reference to the schematic illustration in FIG. 3 and on the basis of the longitudinal section II through the mask holder 66 in FIG. 4. The mask holder 66 comprises a rectangular plate having a rectangular opening 62, into which the mask 65 is received. The mask 65 rests on three hemispherical bearing locations 70a, 70b, 70c, which are connected to the mask holder 66 via three webs 69a, 69b, 69c. The edge of the opening 62 has projections 71. Edges whose position on the mask holder 65 is accurately defined are formed at the projections 71. In particular the distances from said edges to the bearing locations and to the supports 68 are known. By measuring the distances between the edges 72a, 72b, 72c of the projections 71a, 71b, 71c of at least two adjacent edges 65a, 65b of the mask, the position of the mask 65 within the mask holder 66 is determined.

A device for measuring the position of the mask 65 on the mask holder 66, in one variant of the parking station 35, is formed on the parking station itself. The device is designed for measuring the distance between the edge 72a, 72b, 72c of a projection 71a, 71b, 71c and the mask edge 65a, 65b.

The mask holder 66 is placed on the parking station 35 in such a way that its supports 68a, 68b, 68c latch in notches 36a, 36b, 36c formed on the table of the parking station 35. The position of the mask holder 66 on the parking station 35 is defined by means of this measure. In the region of the projections 71a, 71b, 71c there are formed devices for measuring the distance between the respective projection 71a, 71b, 71c and the opposite section of the edge of the mask 65a, 65b.

A device for measuring the distance between the edge of a projection and the mask edge is explained with reference to the schematic illustration in FIG. 4. An illumination device 150 is mounted above the gap formed by the edge of the projection and by the mask edge. Said illumination device serves for illuminating the gap 73 with illumination radiation in the VIS range. Below the gap a detector 155 is mounted on the surface of the table of the parking station, said detector being embodied as a CCD chip. With the illumination device 150 switched on, the detector 155 is illuminated by the illumination radiation in so far as the latter is delimited by the gap 73. In other words, a strip with increased intensity will be detectable on the detector 155, said strip being delimited by the shadows of the edges of the mask 65a and the edge of the projection 72a. After calibration has been performed, the width of the gap 73 is determined by the determination of the width of the strip.

The described measurement of the gap width is performed on at least three projections 71a, 71b, 71c in conjunction with at least two adjacent edges 72a, 72b, 72c of the mask. In one variant of the device for measuring the position of the mask 65 on the mask holder 66, a dedicated device is implemented for each gap width to be measured.

The control of the devices for measuring the gap width and the evaluation of the measurement results are performed by the computing unit 45.

If the position of the mask on the mask holder is known, the positions of the bearing locations 70a, 70b, 70c on the mask can be determined, as described above, from the known dimensions of the mask holder.

If a mask bears on three bearing locations, it experiences a flexure as a result of its own weight. This deformation has to be taken into account in the highly accurate measurement of a mask. The dimensions of a mask to be measured and the properties of the material of the mask are generally known. The flexure of the mask can be determined in conjunction with the determined positions of the bearing points. In this respect, also see the disclosure of the published German Patent Application DE102007033814.

For carrying out the measurements, in particular for calculating the flexure of the mask, the position of the mask on the mask holder must be situated within a predefined region. If the described measurement in the parking station reveals that the position of the mask lies outside the setpoint region, it is corrected. For correcting the position, the mask is raised by the second robot and placed again in the corrected position. The determination of the correction values and the control of the method are performed by the computing unit 45.

Figure 5:
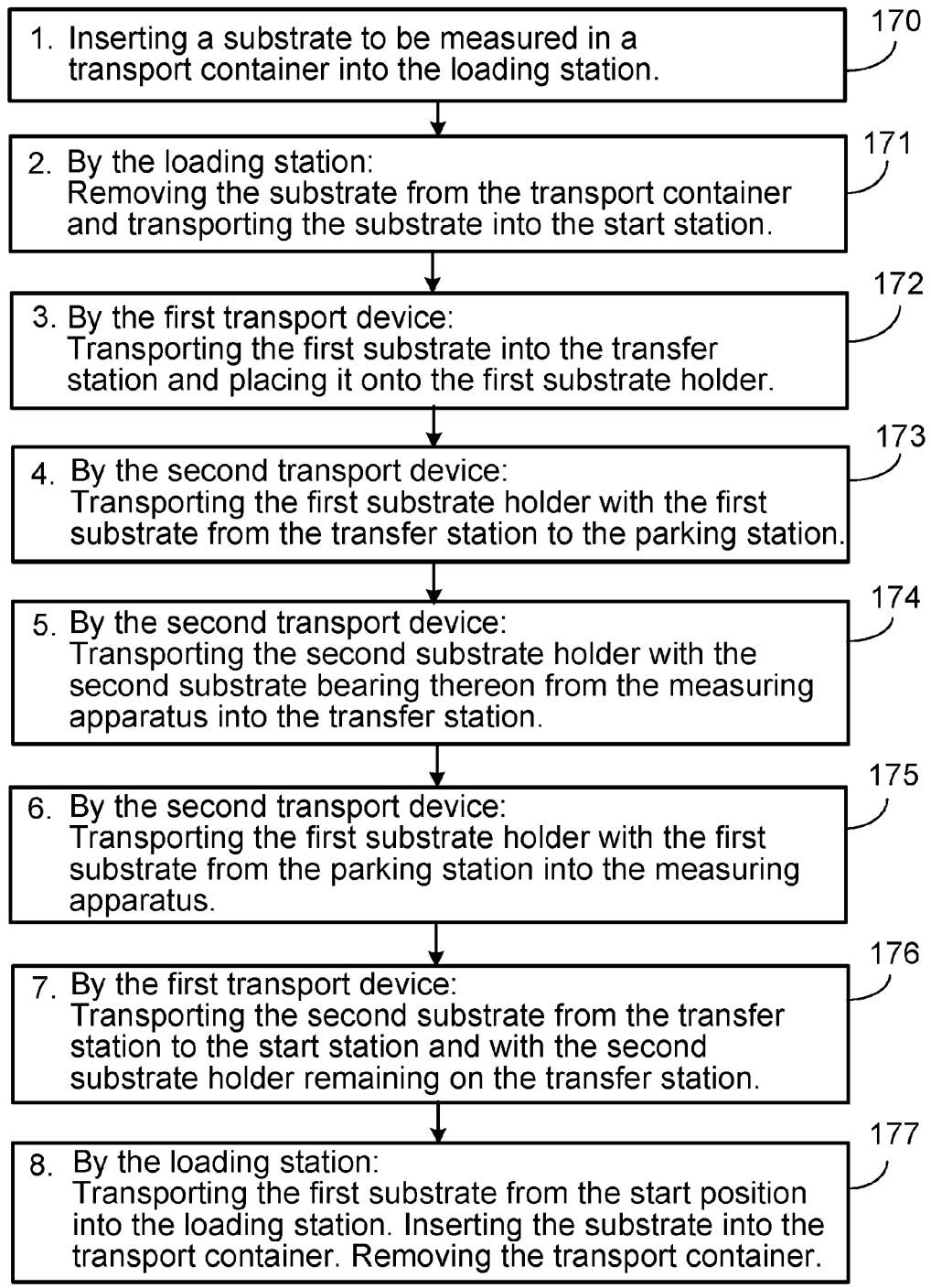
FIG. 5: shows a flow diagram of a method for introducing a substrate into a measuring apparatus.

The method for introducing a substrate into a measuring apparatus is explained with reference to the flow diagram in FIG. 5. The numbering of the steps serves for elucidating one possible order. Further orders of the steps are possible.

The substrate 60, for example a mask, is stored in a transport container for protection against contamination and against mechanical destruction. In a first step 170 of the method, the first mask is inserted into the loading station 10. In a second step, by means of the loading station 10, the transport container is automatically opened, the first mask 60 is removed and introduced through the sliding door 11 into the start station 15 and thus simultaneously into the climate-controlled chamber 40. In the start station 15, the first mask 60 is placed on the table of the start station 15.

In the third step 172 of the method, the mask is transported to the transfer station 25 by the first transport device 20, which is embodied as a robot. At this point in time a first substrate holder 61 embodied as a mask holder already lies on the transfer station 25. The mask 65 is received by the rectangular opening 62 of the first mask holder 61, as described above.

In a fourth step 173, the first mask holder 61 is transported from the transfer station 25 to the parking station 35 by the second transport device 30, which is embodied as a robot.

The position of the mask 60 within the mask holder 61 is determined in the parking station 35. This was explained above on the basis of the device for measuring the distances between the mask edge and the edges of the projections.

In one variation of the method, the mask 60 and the first mask holder 61 are placed in a parking station without further measures being implemented.

In the fifth step, the second robot 30 removes the second mask holder 66 with the second mask 65 from the measuring apparatus 100 and transports it into the transfer station 25.

In the sixth step 175, the second robot 30 transports the first mask holder 61 with the first mask 60 into the measuring apparatus 100.

In the seventh step 176, the first robot 20 transports the second mask to the start station 15. The second mask holder 66 remains in the transfer station 25.

The second mask holder 66, which remained in the transfer station 25 in the seventh step 176, is used again in the next cycle, i.e. during the measurement of a further mask 65. In the next cycle, the second mask holder 66 becomes the first mask holder 61 and the first mask becomes the second mask 60. A further mask to be measured, which during the measurement of the first mask 60 now present in the measuring apparatus, is introduced as new first mask.

In the eighth step 177, the first mask 60 is transported from the start station 15 into the loading station 10, placed into the transport container again and removed from the loading station 10.

In one variant of the method, the sixth step 175, transporting the first mask into the measuring apparatus 100, and the seventh step 176, transporting the second mask 65 to the start station 15, followed by the eighth step 177, can proceed at least partly simultaneously.

In one variant of the method, the masks 60, 65 are transported and measured without the mask holders 61, 66.

In one variant of the method, the substrates 60, 65 are embodied as wafers. If substrate holders 61, 66 are used, they are embodied as wafer holders.

What is claimed is:

1. A method for introducing a substrate into a measuring apparatus, comprising the following steps:
    a) providing a first substrate in a start station;
    b) transporting the first substrate to a parking station, comprising
        b1) transporting the first substrate from the start station to a transfer station,
        b1a) providing a first substrate holder in the transfer station and placing the first substrate on the first substrate holder, wherein the further transport of the first substrate is performed jointly with the first substrate holder, and
        b2) transporting the first substrate from the transfer station to the parking station;
    c) transporting a second substrate from the measuring apparatus to the start station, comprising
        c1) transporting the second substrate from the measuring apparatus to the transfer station, and
        c2) transporting the second substrate from the transfer station to the start station,
        wherein the second substrate is arranged on a second substrate holder during the transport from the measuring apparatus in step c1), wherein the transport as far as the transfer station is performed jointly with the second substrate holder; and
    d) transporting the first substrate from the parking station into the measuring apparatus,
    wherein the transfer station, the parking station, and the measuring apparatus are disposed in a same climate controlled chamber that has temperature regulation to maintain the temperature at a substantially constant level,
    wherein the first and second substrate holders do not leave the climate-controlled chamber during the time period that the first and second substrates are transferred from the transfer station to the measuring apparatus and from the measuring apparatus back to the transfer station,
    wherein the first and second substrate holders are exposed to the substantially constant temperature of the climate-controlled chamber as the first and second substrate holders move among the transfer station, the parking station, and the measuring apparatus, and
    wherein measurements of at least one of coordinates or positions are carried out on the second substrate at the measuring apparatus during a first time period, the first substrate is transported from the transfer station and placed at the parking station during a second time period, and the first time period overlaps the second time period.

2. The method according to claim 1, wherein steps b) and c) are performed at least partly simultaneously.

3. The method according to claim 1, wherein in step c2) the second substrate holder remains in the transfer station and the second substrate is transported to the start station.

4. The method according claim 1, wherein the first substrate is prepared for measurement in the parking station.

5. The method according to claim 4, wherein preparing the first substrate for measurement in the parking station comprises determining the position of the first substrate relative to the substrate holder.

6. The method according to claim 4, wherein preparing the first substrate for measurement in the parking station comprises aligning the position of the first substrate relative to the substrate holder.

7. The method according to claim 4, wherein a temperature of the substrate is adapted to an ambient temperature for the preparation.

8. The method of claim 1 in which the coordinate measuring apparatus comprises a registration measuring apparatus.

9. The method of claim 1, comprising regulating the temperature in the climate controlled chamber to maintain the temperature at the substantially constant level.

10. The method of claim 9 in which regulating the temperature in the climate controlled chamber comprises regulating the temperature in the climate controlled chamber in which a setpoint temperature is predefined, and the deviation of the actual temperature from the setpoint temperature is less than 0.5 K.

11. A method comprising:
    providing a first substrate holder at a transfer station within a climate controlled chamber that has temperature regulation to maintain the temperature at a substantially constant level;
    transporting a first substrate from a start station in the climate controlled chamber to the transfer station, and placing the first substrate on the first substrate holder at the transfer station;
    transporting the first substrate and the first substrate holder together from the transfer station to a parking station within the climate controlled chamber;
    transporting the first substrate and the first substrate holder together from the parking station to a measuring apparatus within the climate controlled chamber;
    providing a second substrate holder at the transfer station;
    transporting a second substrate from a loading station outside of the climate controlled chamber to the start station;
    transporting the second substrate from the start station to the transfer station, and placing the second substrate on the second substrate holder at the transfer station;
    transporting the second substrate and the second substrate holder together from the transfer station to the parking station; and
    measuring at least one of coordinates or positions of features on the first substrate at the measuring apparatus in the process of transporting the second substrate from the start station to the transfer station and from the transfer station to the parking station,
    wherein the first and second substrate holders do not leave the climate-controlled chamber during the time period that the first and second substrates are transferred from the transfer station to the measuring apparatus and from the measuring apparatus back to the transfer station, and
    wherein the first and second substrate holders are exposed to the substantially constant temperature of the climate-controlled chamber as the first and second substrate holders move among the transfer station, the parking station, and the measuring apparatus.

12. The method of claim 11 in which measuring at least one of coordinates or positions of features on the first substrate comprises recording an image of a surface of the first substrate and analyzing the image to determine the coordinates or positions of the features on the first substrate.

13. The method of claim 11, comprising measuring a position of the second substrate relative to the second substrate holder when the second substrate is at the parking station.

14. The method of claim 11, comprising aligning a position of the second substrate relative to the second substrate holder when the second substrate is at the parking station.

15. The method of claim 11, comprising, at the parking station, adapting a temperature of the second substrate to an ambient temperature inside the climate controlled chamber to prepare for measurements at the measuring apparatus.

16. The method of claim 11, comprising transporting the first substrate and the first substrate holder together from the measuring apparatus to the transfer station, and transporting the first substrate from the transfer station to the start station with the first substrate holder remaining on the transfer station.

17. The method of claim 16 in which a first process and a second process are performed at least partly simultaneously,
wherein the first process comprises transporting the first substrate and the first substrate holder together from the measuring apparatus to the transfer station, and transporting the first substrate from the transfer station to the start station, and
wherein the second process comprises transporting the second substrate from the start station to the transfer station, and transporting the second substrate and the second substrate holder together from the transfer station to the parking station.

18. The method of claim 11, comprising providing a first transport device and a second transport device in the climate controlled chamber;
wherein transporting the first substrate from the start station to the transfer station comprises using the first transport device to transport the first substrate from the start station to the transfer station;
wherein transporting the first substrate and the first substrate holder together from the transfer station to the parking station comprises using the second transport device to transport the first substrate and the first substrate holder together from the transfer station to the parking station.

19. The method of claim 11 wherein providing the first substrate holder at the transfer station within the climate controlled chamber comprises providing the first substrate holder at the transfer station within the climate controlled chamber in which a setpoint temperature is predefined, and the deviation of the actual temperature from the setpoint temperature is less than 0.5 K.

20. The method of claim 11 in which at least one of coordinates or positions of features on the first substrate is measured at the measuring apparatus during a first time period, the second substrate is transported from the transfer station to the parking station and placed at the parking station during a second time period, and the first time period overlaps the second time period.

21. A method comprising:
in a climate controlled chamber that has temperature regulation to maintain the temperature at a substantially constant level, measuring at least one of coordinates or positions of features on a first substrate at a measuring device, in which the first substrate is placed on a first substrate holder;
transporting a second substrate from a loading station outside of the climate controlled chamber to a start station within the climate controlled chamber;
transporting the second substrate from the start station to a transfer station within the climate controlled chamber, placing the second substrate on a second substrate holder, and transferring the second substrate and the second substrate holder to a parking station within the climate controlled chamber;
transporting the first substrate and the first substrate holder from the measuring device to the transfer station, and transferring the first substrate to the start station while leaving the first substrate holder in the transfer station;
transporting the second substrate and the second substrate holder from the parking station to the measuring device;
transporting the first substrate from the start station to the loading station;
wherein the first and second substrate holders do not leave the climate-controlled chamber during the time period that the first and second substrates are transferred from the transfer station to the measuring apparatus and from the measuring apparatus back to the transfer station,
wherein the first and second substrate holders are exposed to the substantially constant temperature of the climate-controlled chamber as the first and second substrate holders move among the transfer station, the parking station, and the measuring apparatus, and
wherein the transporting of the second substrate from the parking station to the measuring device, and transporting of the first substrate from the measuring device to the start station, followed by transporting the first substrate from the start station to the loading station, proceed at least partly simultaneously.

22. The method of claim 21 in which the substrate comprises at least one of a wafer or a photolithography mask.

23. The method of claim 21 wherein measuring at least one of coordinates or positions of features on the first substrate at the measuring device in the climate controlled chamber comprises measuring at least one of coordinates or positions of features on the first substrate at the measuring device in the climate controlled chamber in which a setpoint temperature is predefined, and the deviation of the actual temperature from the setpoint temperature is less than 0.5 K.

24. The method of claim 21 in which the at least one of coordinates or positions of features on the first substrate is measured at the measuring device during a first time period, the second substrate is transferred from the start station to the parking station and placed at the parking station during a second time period, and the first time period overlaps the second time period.

* * * * *

UNITED STATES PATENT AND TRADEMARK OFFICE
CERTIFICATE OF CORRECTION

| | | |
|---|---|---|
| PATENT NO. | : 10,381,250 B2 | Page 1 of 1 |
| APPLICATION NO. | : 15/263673 | |
| DATED | : August 13, 2019 | |
| INVENTOR(S) | : Nico Wohlfarth | |

It is certified that error appears in the above-identified patent and that said Letters Patent is hereby corrected as shown below:

In the Specification

<u>Column 4</u>
Line 33, after "arm" insert -- . --

In the Claims

<u>Column 9</u>
Line 62, in Claim 4, after "according" insert -- to --

Signed and Sealed this
Eighth Day of October, 2019

Andrei Iancu
*Director of the United States Patent and Trademark Office*